United States Patent
Lim et al.

(10) Patent No.: US 6,378,200 B1
(45) Date of Patent: Apr. 30, 2002

(54) DYNAMICALLY RECONFIGURABLE ASSEMBLY LINE FOR ELECTRONIC PRODUCTS

(75) Inventors: Ka Tiek Lim, Bayan Lepas; Hun Chiang Lim, Penang, both of (MY)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/933,319

(22) Filed: Sep. 18, 1997

(51) Int. Cl.[7] .................................................. H05K 3/30
(52) U.S. Cl. .............................. 29/832; 29/836; 29/740
(58) Field of Search ........................... 29/832, 711, 712, 29/742, 740, 836

(56) References Cited

U.S. PATENT DOCUMENTS

| | | | |
|---|---|---|---|
| 3,706,122 A | * 12/1972 | La Valle | 29/711 |
| 4,683,644 A | * 8/1987 | Tange et al. | 29/740 |
| 4,954,453 A | * 9/1990 | Venutolo | 29/742 |
| 5,258,915 A | 11/1993 | Billington et al. | 364/468 |
| 5,329,690 A | * 7/1994 | Tsuji et al. | 29/711 |
| 5,727,301 A | * 3/1998 | Kugo | 29/742 |

* cited by examiner

*Primary Examiner*—Peter Vo
*Assistant Examiner*—A. Dexter Tugbang
(74) *Attorney, Agent, or Firm*—Frank M. Scutch, III

(57) ABSTRACT

A method of reconfiguring a production line for fabricating printed circuit board assemblies to achieve maximum efficiency and maximum flexibility is disclosed. The production line has one or more placement stations (16, 18, 20), a reflow oven (22), a conveyor (24) and a controller (30). The controller communicates with the various components (placement stations, reflow oven, conveyor) of the production line to transfer information related to the state of assembly of some of the printed circuit board assemblies (15, 17, 19) that are being processed. The controller also communicates information related to the status of the various other stations. The operational functionality of one or more of the placement stations, the reflow oven, or the conveyor is altered in response to the communication by the controller. Other remaining modules continue operation unaltered during this step of dynamic reconfiguration.

4 Claims, 2 Drawing Sheets

DYNAMICALLY RECONFIGURABLE ASSEMBLY LINE FOR ELECTRONIC PRODUCTS

FIELD OF THE INVENTION

This invention relates to an assembly line for manufacturing electronic assemblies such as printed circuit boards containing discrete components. The invention is particularly useful for, but not necessarily limited to, maximizing the utilization of the assembly line while at the same time providing maximum flexibility in product mix and volume.

BACKGROUND

In production assembly lines used for mounting electronic components to circuit boards, the circuit boards are generally conveyed through the assembly line on conveyors. Various assembly processes such as solder stenciling, component mounting and reflow soldering are typically performed. Typically, the conveyors are parallel tracks that carry the circuit board through the various stages of assembly, from one station to another. During conveying it is common practice to support the circuit boards along the edges and maintain them in a substantially horizontal plane and isolated from vibration so that the possibility of component misalignment is reduced.

In conventional systems, the assembly line is usually optimized to enable high efficiency and throughput. This is because of the substantial capital. cost of the highly sophisticated and automated equipment employed in modern circuit board assembly lines. A typical line costs two million dollars, and some are as high as ten million dollars. Obviously, one is desirous of operating at highest efficiency in order to realize maximum return on the dollars invested in the equipment, and assembly lines are typically dedicated to a single product so that down time required to reconfigure the assembly line is minimized.

On the other hand, the demands of the modern marketplace are such that it is desirous to produce a variety of products in order to satisfy the increasing appetite for electronics that provide features that are tailored to the individual consumer. This means that either several dedicated lines must be employed, or the line must be frequently reconfigured. In the first case, the capital cost for additional lines is high, and additional engineering overhead must be provided in order to keep these sophisticated lines running-smoothly. In the second instance, reconfiguring the line requires that the line be stopped and reconfigured. Even with today's formidable computing power, downloading new programs consumes precious time and decreases the utilization of the assembly line. Utilization is the converse of flexibility, and thus, the manufacturer is forced to choose from two mutually exclusive goals, high flexibility or high utilization. The industry has struggled in vain for many years in attempts to find a solution to this dilemma. To date, all prior art solutions have been a compromise, sacrificing one goal in pursuit of the other. The ability to have maximum utilization and maximum flexibility on the same assembly line would be a valuable addition to the art.

SUMMARY OF THE INVENTION

Figure 1:
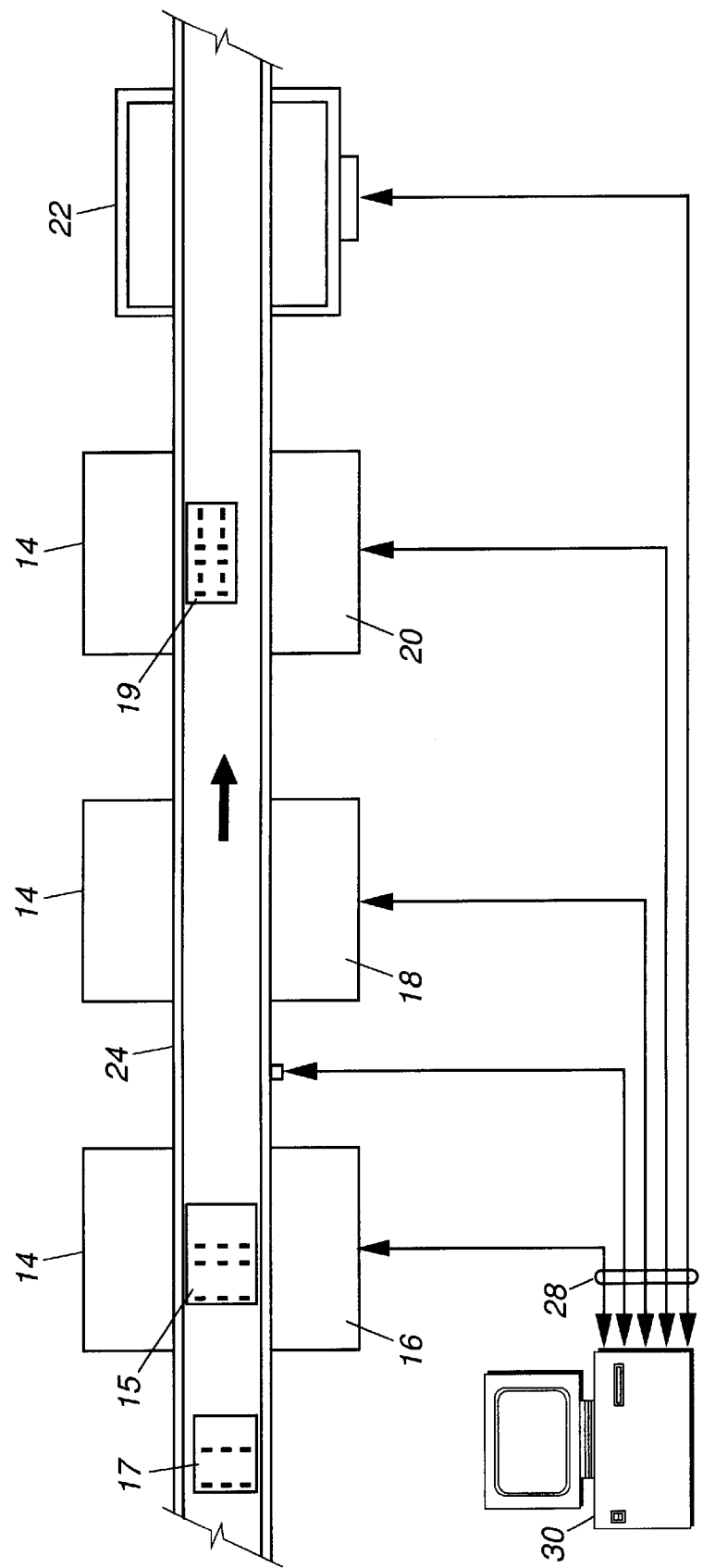
FIGS. 1 and 2 are schematic views illustrating a dynamically reconfigurable production line in accordance with the invention.

A method of reconfiguring a production line for fabricating printed circuit board assemblies to achieve maximum efficiency and maximum flexibility is disclosed. The production line has one or more placement stations, a reflow oven, a conveyor and a controller. The controller communicates with the various components (placement stations, a reflow oven, a conveyor) of the production line to transfer information related to the state of assembly of some of the printed circuit board assemblies that are being processed. The controller also communicates information related to the status of the various other stations. The operational functionality of one or more of the placement stations, the reflow oven, or the conveyor is altered in response to the communication by the controller. The other remaining modules continue operation unaltered during this step of dynamic reconfiguration.

While a first activity is being performed on a first electronic assembly in the first placement workcell, a controller monitors other placement workcells that are downstream. If a downstream workcell is idle, then it sends a signal to the controller that indicates such, and the first placement workcell is dynamically reconfigured. This can occur while the first workcell is in operation, in response to a signal from the controller. After reconfiguration, the conveyor transports the first electronic assembly from the first placement workcell to the second placement workcell. A second electronic assembly is then conveyed into the first placement workcell, and a second activity is performed on the first electronic assembly in the second placement workcell. The required activity is also performed on the second electronic assembly in the dynamically reconfigured first placement workcell.

The controller is responsive to information related to the degree of completion of the activity that is being performed on the various electronic assemblies. In some instances, the operation of the remaining modules continues unaltered during the step of dynamically reconfiguring.

DETAILED DESCRIPTION OF THE PREFERRED EMBODIMENTS OF THE INVENTION

While the specification concludes with claims defining the features of the invention that are regarded as novel, it is believed that the invention will be better understood from a consideration of the following description in conjunction with the drawing figures, in which like reference numerals are carried forward. When an electronic product is being assembled, it typically flows down an assembly line or production line. To best understand our invention, the following description assumes that the production line has been running for some period of time and that it contains a number of electronic products or assemblies in various stages of completion at the various stations. The electronic product typically begins as a printed circuit board (PCB), upon which various components such as resistors, transistors, microprocessors, capacitors, etc. are placed. The components are placed onto the board by robots or other highly automated machines, such as chip shooters. It should be understood and appreciated that our invention is directed to the use of robots or other machinery as opposed to manual systems where components are placed onto the board by human hands. These various components are then typically attached by reflow soldering them onto the printed circuit board. The production line consists of one or more (typically several) placement machines such as robots. The placement machines are variously referred to as pick-and-place machines, workcells, robots, workstations, placement modules, chip-shooters, etc. in the industry parlance. Each workcell or station typically has a predetermined set of components that can be placed on the PCB. These components are loaded into feeders contained in the workcell, and the robot or placement means selects from the various feeders to place the desired set of components on the PCB. A software program resident in the workcell directs the robot as to which components to select and where to place them on the PCB. The placement of components. in each workcell requires a finite period of time, and when the cycle in each workcell is complete, the PCB is then conveyed into the next workcell.

Figure 2:
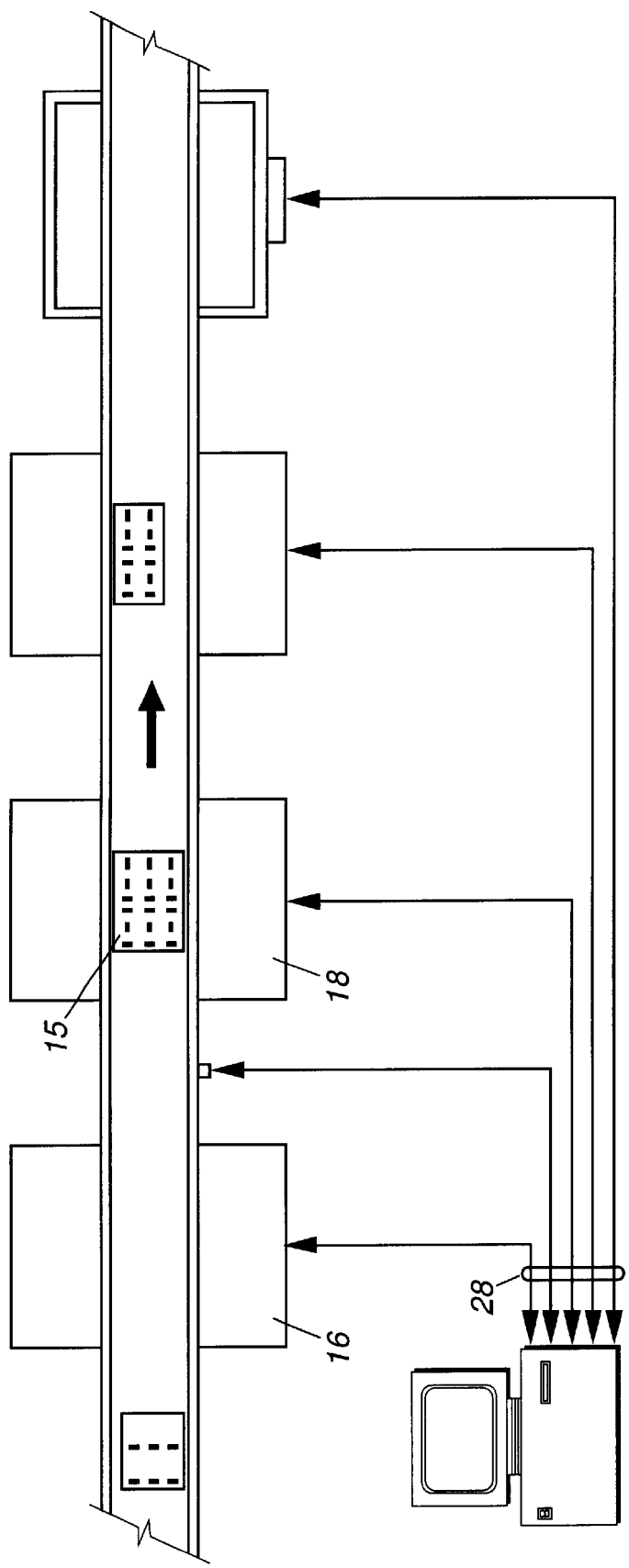

Although the aforedescribed system of placing components is typical in the electronics industry, our invention deviates from the prior art in the following way. Referring now to FIG. 1, a first PCB 15 enters the first workcell 16 and the workcell begins placing components or parts onto the PCB. Another PCB 17 is queued up waiting for the first workcell 16 to finish its cycle. If, during the course of the cycle of placing the various components, another workcell 18, 20 that is downstream (i.e. farther down the production line) is idle or is nearing the end of its cycle, the first workcell is dynamically reconfigured (i.e. the program is altered while it is running). The cycle of placing components in the first workcell 16 is interrupted and abbreviated so that the PCB 15 can now move into the next, or second, workcell 18, which was idle. After the first PCB 15 exits the first workcell 16, another, or second, PCB 17 enters the first workcell to have various components placed thereon. Depending on the state of the production line, the first workcell can either be reconfigured prior to the second PCB 17 entering, or it can remain in the same configuration state as it was when the first PCB 15 left. Referring now to FIG. 2, the second workcell 18 now places the components that were originally destined to be placed on the first PCB 15 prior to the first workcell being dynamically reconfigured. The second workcell 18 typically has a set of components that it normally places on the PCB, and depending on the available time and state of the workcells further downstream, these may or may not be completely placed. The feeders in the second workcell 18 contains a subset of the components found in the first workcell. The principle, heretofore unrealized, is that each workcell is capable of placing some or all of the parts of the workcell that is upstream of itself, and both workcells are capable of being dynamically reconfigured. Thus, the amount of time that any single workcell in the production line is idle is minimized and the efficiency of the line is maximized. To rephrase, when a bottleneck occurs at a certain station, it can be immediately alleviated by shifting some of the workload to one or more downstream stations that have idle capacity. In addition, or alternatively, some of the workload can be shifted to one or more upstream stations that have idle capacity.

One skilled in the art should now appreciate that the prior art solutions to this problem attempted to optimize the software program at each workcell to balance the line, based on some theoretical model or historical data. The program was then 'frozen' into each station. However, even the most sophisticated modeling system can only predict the future based on past performance, and once the program is 'frozen' into the workcell memory, the line instantly becomes suboptimized whenever a deviation from the model occurs, as it always does. By dynamically reconfiguring the production line based on the actual current, states of the various components in the system, we can now balance the production line so that it continually operates at maximum efficiency. And clearly, having the ability to dynamically reconfigure the line also provides the maximum flexibility, because each workcell can be instantly altered to reflect a change in the product mix.

In practice, information and signals are passed back and forth between the various workcells or modules and a master controller 30. The controller is typically a high speed computer that serves to allocate resources amongst the various workcells in order to optimize the efficiency of the production line. Depending on the actual implementation of the system, the controller 30 may simply pass a signal to the first and second workcells 16, 18 and these workcells then alter the software within their respective systems. Or, the controller can actively modify the software program for each workcell and pass it to the respective workcell for implementation. In either case, some type of information on the state of the cycle in each workcell is being passed from the workcells to the controller 30, and other information (e.g. instructions for dynamically reconfiguring) is passed back to these same workcells. As a result of this information flow, the operational functionality of one of the workcells can be dynamically reconfigured while the others continue to operate unaltered.

Although we have, to this point, disclosed modifying the operational functionality of robot workcells or pick-and-place machines, the principles of our invention can also be applied to other segments of the assembly line, for example, to the conveyor 24, the reflow oven 22 or the solder printer. The screen printer and the reflow oven can be dynamically reconfigured to adjust to the dynamic needs of the product mix. The reflow is typically an oven, but can also be a robot with a heating chamber, thus lending itself to quick reconfiguration. In another example, there may be one or more solder printers that are automatically capable of printing a multiplicity of different patterns on different PCBs, arranged serially or in parallel. Depending on the state of the various printers, each of these printers can be dynamically modified to optimize the throughput of the line. Likewise, by using a conveyor or transport means that is capable of changing speed or accommodating PCBs of various sizes, one can radically reconfigure the production line so that various sizes of PCBs and thus various types of electronic assemblies are produced on the same line at the same time, and in response to changing conditions of utilization of the various workcells in the line. When conventional conveyors are used to convey circuit boards of different widths, a circuit board of one width is conveyed out of the parallel tracks after which the distance between the tracks is adjusted to accommodate a circuit board of a different width. Another method of conveying is disclosed in U.S. Pat. No. 4,759,436 where a conveyor with a plurality of aligned rollers forms a track and corresponding adjustable supports for conveying objects along a curved path. The supports are pivotal about a horizontal axis to accommodate movement of a respective free end that supports one of the objects. This conveyor does not have parallel tracks that need adjustment and can be used to convey circuit boards of different widths. Likewise, U.S. Pat. No. 4,840,268 discloses an adjustable width chain conveyor. The conveyor has two parallel and inclined channels within which are mounted a respective continuous chain coupled to a drive. Each chain can slide inwardly or outwardly to accommodate for small variations in widths of circuit boards being conveyed. Still another means of conveying various sized PCBs is to utilize dual, parallel conveyors on the production line. Two conveyors are run side by side through each of the workstations. This not only allows various sized PCBs to be processed, but can add to the flexibility of the production line by allowing the various workcells to perform different functions on different electronic assemblies. Advantageously, the conveyor can convey circuit boards of different widths without the need for completely conveying one board through the conveyor before boards of a different width can conveyed.

In summary, our novel invention provides a method to process a sequence of electronic assemblies, where the activity being performed on each assembly is different, and where the various workcells can be dynamically reconfigured. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of achieving high utilization and high flexibility on an assembly line for manufacturing electronic assemblies, the assembly line containing at least first and second placement workcells, a transport means for transporting the electronic assembly through the assembly line, and a host computer for the workcells and the transport means, comprising the following steps:

performing a first activity on a first electronic assembly in the first placement workcell;

transferring information relating to the state of the second placement workcell from the second placement workcell to the host computer;

dynamically reconfiguring the first placement workcell at least partially concurrent with the step of performing a first activity and in response to the information transferred to the host computer from the second placement workcell;

transporting the first electronic assembly from the first placement workcell to the second placement workcell via the transport means;

transporting a second electronic assembly into the first placement workcell via the transport means;

performing a second activity on the first electronic assembly in the second placement workcell;

performing a third activity on the second electronic assembly in the dynamically reconfigured first placement workcell.

2. The method as recited in claim 1, further comprising the step of relating information to the controller wherein the controller is responsive to the degree of completion of the activity that is being performed on the first and second electronic assemblies.

3. The method as recited 1 wherein the steps are performed in the order named.

4. The method as recited in claim 1 wherein the operation of any additional workcells in the assembly line continues unaltered during the step of dynamically reconfiguring.

* * * * *

UNITED STATES PATENT AND TRADEMARK OFFICE
CERTIFICATE OF CORRECTION

PATENT NO.    : 6,378,200 B1
DATED         : April 30, 2002
INVENTOR(S)   : Lim et al.

It is certified that error appears in the above-identified patent and that said Letters Patent is hereby corrected as shown below:

<u>Title page,</u>
Item [*], Notice, delete "0" and insert -- 407 --.

Signed and Sealed this

First Day of July, 2003

JAMES E. ROGAN
*Director of the United States Patent and Trademark Office*